United States Patent
Xu

(10) Patent No.: US 9,716,135 B2
(45) Date of Patent: Jul. 25, 2017

(54) ORGANIC THIN FILM TRANSISTOR ARRAY SUBSTRATE AND FABRICATION METHOD THEREOF

(71) Applicant: Shenzhen China Star Optoelectronics Technology Co., Ltd., Shenzhen (CN)

(72) Inventor: Hongyuan Xu, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/778,625

(22) PCT Filed: Aug. 31, 2015

(86) PCT No.: PCT/CN2015/088517
§ 371 (c)(1),
(2) Date: Sep. 21, 2015

(87) PCT Pub. No.: WO2017/016042
PCT Pub. Date: Feb. 2, 2017

(65) Prior Publication Data
US 2017/0025493 A1    Jan. 26, 2017

(30) Foreign Application Priority Data

Jul. 24, 2015  (CN) .......................... 2015 1 0442816

(51) Int. Cl.
*H01L 27/32*     (2006.01)
*H01L 51/05*     (2006.01)
*H01L 51/10*     (2006.01)

(52) U.S. Cl.
CPC ...... *H01L 27/3274* (2013.01); *H01L 27/3279* (2013.01); *H01L 51/052* (2013.01); *H01L 51/0541* (2013.01); *H01L 51/105* (2013.01); *H01L 51/107* (2013.01); *H01L 2227/323* (2013.01); *H01L 2251/5315* (2013.01)

(58) Field of Classification Search
CPC . H01L 27/32; H01L 27/3224; H01L 27/3279; H01L 51/052; H01L 51/0541
See application file for complete search history.

(56) References Cited

U.S. PATENT DOCUMENTS

2008/0246089 A1* 10/2008 Ko ................... H01L 29/66757
                                                       257/347
2013/0134399 A1*  5/2013 Zhang ................ H01L 51/0516
                                                        257/40

(Continued)

*Primary Examiner* — Phuc Dang

(57) ABSTRACT

The present invention discloses an organic thin film transistor array substrate and a fabrication method thereof. The fabrication method is that a metal layer is first deposited successively on a substrate and followed by depositing a layer of Indium Tin Oxide (ITO), and then a photoresist layer is covered thereon to form a data line, a source electrode, a drain electrode and a pixel electrode by a first mask process. Subsequently, an organic semiconductor layer, a gate electrode, a scanning line, and a passivation layer are formed successively. Finally, a region where the pixel electrode, i.e. an anode of an OLED device, is situated and covered with the passivation layer is excavated an opening and allowing the underlying pixel electrode to be exposed to the outside. Then, a layer of OLED material is deposited on the exposed ITO pixel electrode to form an OLED device.

12 Claims, 6 Drawing Sheets

(56) References Cited

U.S. PATENT DOCUMENTS

| | | | |
|---|---|---|---|
| 2014/0175385 A1* | 6/2014 | Li | H01L 27/3248 257/40 |
| 2014/0267970 A1* | 9/2014 | Kuki | G02F 1/1339 349/47 |
| 2015/0179812 A1* | 6/2015 | Suzumura | H01L 29/7869 257/43 |
| 2016/0197165 A1* | 7/2016 | Kim | H01L 29/66765 438/163 |

* cited by examiner

ORGANIC THIN FILM TRANSISTOR ARRAY SUBSTRATE AND FABRICATION METHOD THEREOF

RELATED APPLICATIONS

This application is a National Phase of PCT Patent Application No. PCT/CN2015/088517 having International filing date of Aug. 31, 2015, which claims the benefit of priority of Chinese Patent Application No. 201510442816.4 filed on Jul. 24, 2015. The contents of the above applications are all incorporated by reference as if fully set forth herein in their entirety.

BACKGROUND OF THE INVENTION

Field of the Invention

The present invention relates to liquid crystal display (LCD) technology, and more particularly to an organic thin film transistor (OTFT) array substrate and a fabrication method thereof.

Description of Prior Art

An OTFT is a thin film transistor composed of an organic compound which acts as a semiconductor material, and the OTFT can be produced at low temperatures or at room temperature. Accordingly, lighter, thinner, and cheaper plastics can be chosen as a substitute for glass to be used for an OTFT substrate. The fabrication process for the OTFT is simple in comparison with that of a conventional inorganic thin film transistor because its requirements in environmental conditions for film forming and in purity are lower, so that its fabrication cost is less. Its features such as simple fabrication processes and an excellent flexibility enhance its opportunities of applications in many areas, e.g. fields of flexible displays, electronic skins, flexible sensors, and so forth.

In conventional OTFT fabrication solutions, generally multiple masks, lithography, and etching processes are required to complete a fabrication of an OTFT array substrate. If the number of processes in masks, lithography, and etching required in an OTFT array substrate can be decreased, then the process time of the OTFT array substrate can be shorten and its cost of fabrication processes can be reduced. In addition, a metal material having a lower working function such as silver (Ag) is generally chosen as the electrode material of the OTFT at the present time in order to reduce contact resistance. However, Ag without being covered with a protective layer is easily oxidized and results in a deteriorated conductivity.

In response to these problems, the present invention provides a new method of fabricating an OTFT array substrate, not only the overall number of processes in masks, lithography, and etching required in the fabrication of an OTFT array substrate can be decreased, but also electrodes in the metal layer, e.g. Ag electrodes, can be protected to prevent oxidation of the electrodes from occurring in the subsequent processes. Furthermore, an impact on the quality of a device made of the OTFT array can be avoided.

SUMMARY OF THE INVENTION

The objective of the present invention is to provide an OTFT array substrate and its fabrication method for improving fabrication processes of the OTFT array substrate in the prior art and enhancing the efficiency of production processes.

The objective of the present invention is to provide an OTFT array substrate that has a structure is suitable for a top-emission type OLED (Organic Light-Emitting Diode) device, which can protect electrodes in a metal layer and prevent oxidation of the electrodes from occurring in the subsequent processes, and thereby avoids an impact on the quality of a device made of the OTFT array.

To achieve the foregoing objectives, an OTFT array substrate is provided according to an embodiment of the present invention, the OTFT array substrate comprises:

a base substrate;

a metal layer formed on the substrate and an ITO layer formed on the metal layer to expose a portion of the metal layer to the outside of the ITO layer after being patterned so that a source electrode and a drain electrode are formed by using the partially exposed metal layer, as well as a data line and a pixel electrode are formed by using the metal layer and the ITO layer;

an organic semiconductor layer covering the source electrode and the drain electrode to form an active layer;

an organic insulating layer disposed on the organic semiconductor layer and exposing the pixel electrode to the outside;

a gate electrode and a scanning line disposed on the organic insulating layer; and a passivation layer disposed on the gate electrode and covering the organic insulating layer.

In the OTFT array substrate according to an embodiment of the present invention, the ITO pixel electrode is exposed after the passivation layer has been patterned and the organic insulating layer and the passivation layer situated on the surface of the region of the pixel electrode are removed by a dry etching process.

In the OTFT array substrate according to an embodiment of the present invention, the exposed pixel electrode is an anode of an OLED device and a layer of OLED material is deposited on the exposed ITO pixel electrode to form an OLED device, and the process of depositing a layer of OLED material on the exposed ITO pixel electrode includes, but is not limited to, for example, vapor depositions, sputtering depositions, or the like.

In the OTFT array substrate according to an embodiment of the present invention, the OLED device is a top-emission type OLED device.

An method of fabricating an OTFT array substrate is provided according to an embodiment of the present invention, the method of fabricating an OTFT array substrate comprises the steps of:

providing a base substrate;

depositing a metal layer and an ITO layer on the base substrate, subsequently a photoresist layer being covered thereon and then forming a data line, a source electrode, a drain electrode and a pixel electrode by a patterning process;

coating an organic semiconductor layer on the array substrate having the data line, the source electrode, the drain electrode, and the pixel electrode formed thereon and then forming an active layer by a patterning process, subsequently coating an organic insulating layer on the organic semiconductor layer to cover on an entire surface of the work-in-progress array substrate;

depositing a metal layer on the organic insulating layer and then forming a gate electrode and a scanning line by a patterning process, subsequently coating another organic insulating layer on the entire surface of the work-in-progress array substrate to form a passivation layer so that the passivation layer covers on the entire surface of the work-in-progress array substrate;

patterning the passivation layer, subsequently removing the organic insulating layer and the passivation layer situated on the surface of the pixel electrode by a dry etching process to expose the ITO pixel electrode; and depositing a layer of OLED material on the exposed ITO pixel electrode to form an OLED device.

In the method of fabricating an OTFT array substrate according to an embodiment of the present invention, the OLED device is a top-emission type OLED device.

An method of fabricating an OTFT array substrate is provided according to another embodiment of the present invention, the method of fabricating an OTFT array substrate comprises the steps of:

providing a base substrate;

depositing a metal layer and an ITO layer on the base substrate, subsequently covering a photoresist layer thereon and then forming a data line, a source electrode, a drain electrode and a pixel electrode by a first mask process;

coating an organic semiconductor layer on the array substrate having the data line, the source electrode, the drain electrode, and the pixel electrode formed thereon and then forming an active layer by a patterning process, subsequently coating an organic insulating layer on the organic semiconductor layer to cover the organic insulating layer on an entire surface of the work-in-progress array substrate;

depositing a metal layer on the organic insulating layer and then forming a gate electrode and a scanning line by a third mask process, subsequently coating an organic insulating layer on the entire surface of the work-in-progress array substrate to form a passivation layer so that the passivation layer covers on the entire surface of the work-in-progress array substrate;

exposing the ITO pixel electrode by performing a fourth mask process to the passivation layer; and depositing a layer of OLED material on the exposed ITO pixel electrode to form an OLED device.

In the method of fabricating an OTFT array substrate according to another embodiment of the present invention, the first mask process comprises patterning the photoresist layer by using a first mask.

In the method of fabricating an OTFT array substrate according to another embodiment of the present invention, the first mask process further comprises wet etching the ITO layer and the underlying metal layer with an etching solution after the photoresist layer has been patterned, and subsequently ashing the photoresist layer by using plasma and removing a photoresist residue.

In the method of fabricating an OTFT array substrate according to another embodiment of the present invention, the surface of the metal layer is covered by the ITO layer except where the source electrode and the drain electrode are located after the first mask process has been completed.

In the method of fabricating an OTFT array substrate according to another embodiment of the present invention, the second mask process comprises patterning the organic semiconductor layer by using a second mask.

In the method of fabricating an OTFT array substrate according to another embodiment of the present invention, the third mask process comprises patterning the metal layer by using a third mask.

In the method of fabricating an OTFT array substrate according to another embodiment of the present invention, the fourth mask process comprises patterning the passivation layer by using a fourth mask.

An OTFT array substrate is provided according to yet another embodiment of the present invention, the OTFT array substrate is fabricated by using the above method of fabricating an OTFT array substrate.

The advantage of the present invention is to simultaneously form a data line, a source electrode, a drain electrode, and a pixel electrode by means of one mask process, and a surface of an underlying metal layer is entirely covered by an ITO layer except where the source electrode and the drain electrode are located. Therefore, the present inventions can decrease not only the number of mask processes and improve the fabrication efficiency, but also can protect electrodes in the underlying metal layer of the OTFT array substrate and prevent them from oxidation occurring in the subsequent processes of the fabrication method.

To allow the foregoing summary of the present invention to be more clearly understood, there are preferred embodiments, which proceed with reference to the accompanying drawings, and are described in detail as follows.

DETAILED DESCRIPTION OF THE INVENTION

Regarding the terms used in this specification, "an embodiment" means that the description in connection with the embodiment serves as an example, instance, or illustration of the disclosure. Furthermore, the articles "a" and "an" used in this specification and the appended claims should generally be construed to mean "one or multiple", unless specified or clear from context to be directed to be a singular form. The preferred embodiments of the present invention will be detailed in the following in combination with the accompanying drawings. Spatially relative terms mentioned herein, such as "above", "beneath", "front", "back", "left", "right", "inner", "outer", "lateral", and the like may be used to describe one element's relationship to another element(s) as illustrated in the figures. The drawings are drawn schematically and the same reference numbers are used to indicate the same or similar components throughout the drawings.

The present invention provides a method of fabricating an OTFT array substrate, generally include the following steps:

Steps 1: A metal layer and an ITO layer are deposited on a substrate, and then a photoresist is covered thereon, and a data line, a source electrode, a drain electrode and a pixel electrode are formed by a first mask process.

Figure 1A:
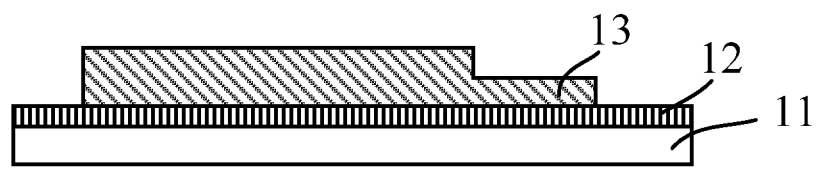
FIGS. 1(a), 1(b), 1(c) and 1(d) are schematic cross-sectional views illustrating a structure of an OTFT array substrate processed by the steps 1 of a fabrication method according to an embodiment of the present invention.
Figure 1B:
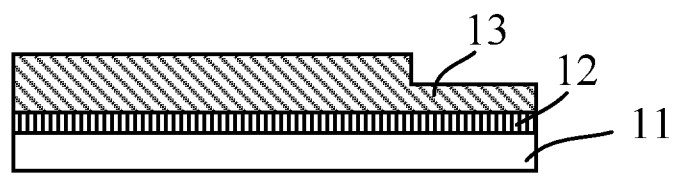
Figure 1C:
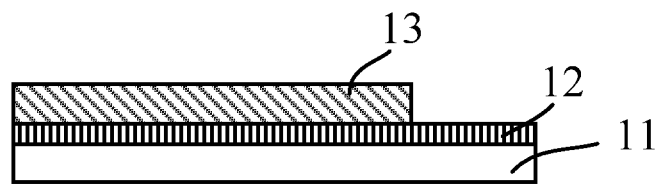
Figure 1D:
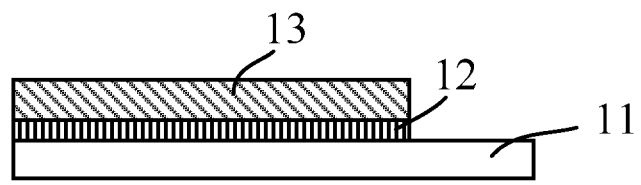

Refer to FIGS. 1(a), 1(b), 1(c) and 1(d), which are schematic, cross-sectional views illustrating a structure of an OTFT array substrate, which has been successively processed by the steps 1 of the fabrication method according to an embodiment of the present invention. Typically, a substrate having an ITO layer is first patterned for forming an anode before an organic thin film is formed by vapor deposition on the substrate with the ITO layer. Accordingly, a metal material such as Ag is deposited on a substrate to form a metal thin film 11, followed by a deposition of a layer of indium tin oxide (ITO) 12. Coating techniques are used to coat a layer of photoresist 13 so that the photoresist layer 13 is disposed on the ITO layer 12, and then followed by processes such as exposure, development, and patterning on the photoresist layer by using a first mask to form the metal layer 11, the ITO layer 12, and the photoresist 13. The schematic cross-sectional view of the OTFT array substrate is seen in FIG. 1(a). The mask may be a halftone mask or grayscale mask. Thereafter, a wet etching process is conducted by using etching solutions such as an ITO etchant, a silver acid or other etching solutions for etching the ITO layer and the underlying metal layer, and thereby a schematic cross-sectional view of the OTFT array substrate is formed as shown in FIG. 1(b). Next, an ashing process, e.g. an oxygen (O2) plasma, is conducted on the photoresist layer and then a photoresist residue removal is operated. Consequently, the photoresist layer has been formed as shown in a schematic cross-sectional view of the OTFT array substrate of FIG. 1(c). Subsequently, the ITO etchant is used for conducting a second wet etching process, and a schematic cross-sectional view of the OTFT array substrate is formed as shown in FIG. 1(d). At this point, the first mask process is over.

Figure 1E:
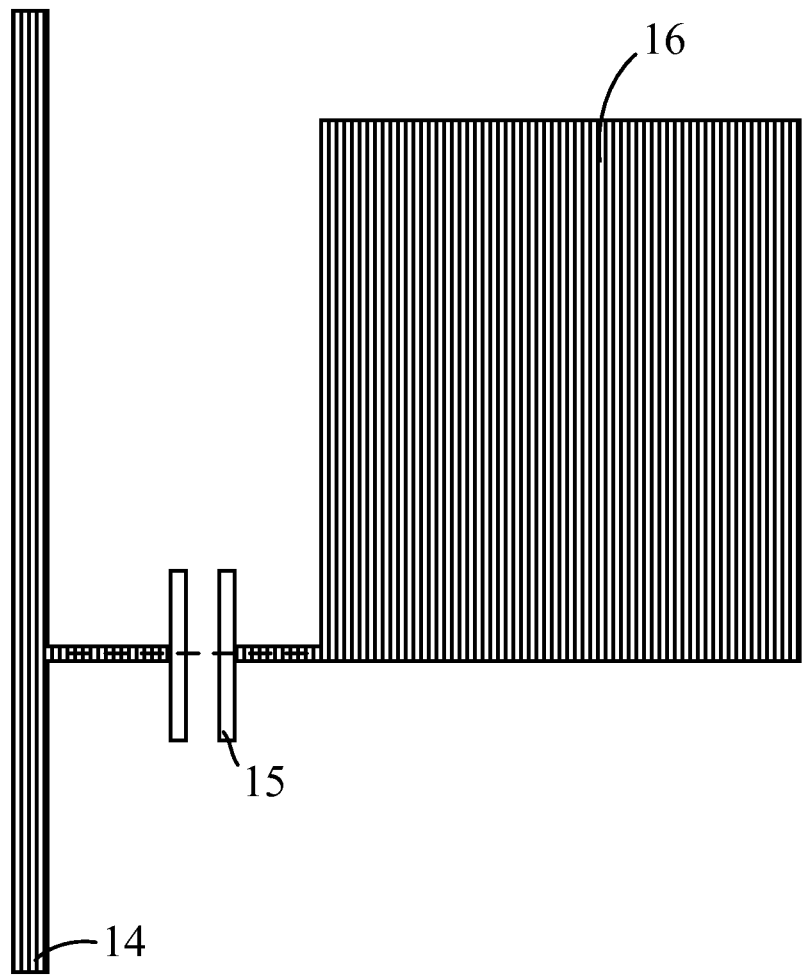
FIG. 1(e) is a schematic top view illustrating the OTFT array substrate after the steps 1 of the fabrication method for the OTFT array substrate have been completed according to an embodiment of the present invention.

At the moment, the data line, the source electrode, the drain electrode and the pixel electrode have been formed. When looking down at the array substrate, a schematic view of a metal pattern can be seen as shown in FIG. 1(e), which includes a region 14 corresponding to the data line, a region 15 corresponding to the source electrode and the drain electrode, and a region 16 corresponding to the pixel electrode.

In particular, the surface of the metal layer is entirely covered with the ITO layer in the foregoing array substrate except where the source electrode and the drain electrode are located, thus the data line and the pixel electrode in the metal layer can be protected. In this manner, oxidation of the data line and the pixel electrode occurring in the subsequent process of fabrication method can be prevented, and negative impact to electron conductivity can be avoided.

Steps 2: An organic semiconductor layer is coated on the array substrate in which the data line, the source electrode, the drain electrode, and the pixel electrode have been formed, and then an active layer is formed by a second mask process. Subsequently, an organic insulating layer is coated on the organic semiconductor layer to cover an entire surface of the work-in-progress array substrate.

Figure 2A:
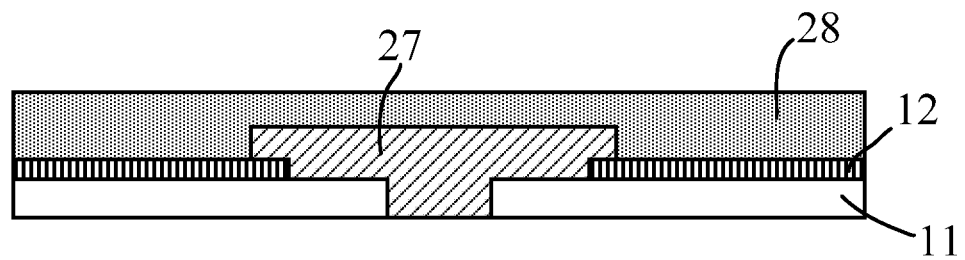
FIG. 2(a) is a schematic cross-sectional view illustrating the structure of the OTFT array substrate processed by the steps 2 of the fabrication method according to an embodiment of the present invention.

Refer to FIG. 2(a), which is a schematic, cross-sectional view illustrating the structure of the OTFT array substrate, which has been successively processed by steps 2 of the fabrication method according to an embodiment of the present invention. Printing processes are adopted in the fabrication of the OTFT. Since most of the organic material has a solubility, its solution can be applied to an inkjet printing method, in which one of coating techniques including, but not limited to, e.g., a dip coating, a spin coating, a blade coating or a contact coating, etc. is used to coat a layer of an organic semiconductor material 27 on the array substrate. This is followed by processes such as exposure, development, and patterning on the organic semiconductor layer by using the second mask to form the schematic, cross-sectional view of the OTFT array substrate as seen in FIG. 2 (a), formed as the active layer of the OTFT device. A coating technique is used again to coat an organic insulating layer 28 so that the entire surface of the array substrate is covered with the insulating layer. At this point, the second mask process is over, and a schematic top view of the array substrate can be seen as shown in FIG. 2 (b).

Figure 2B:
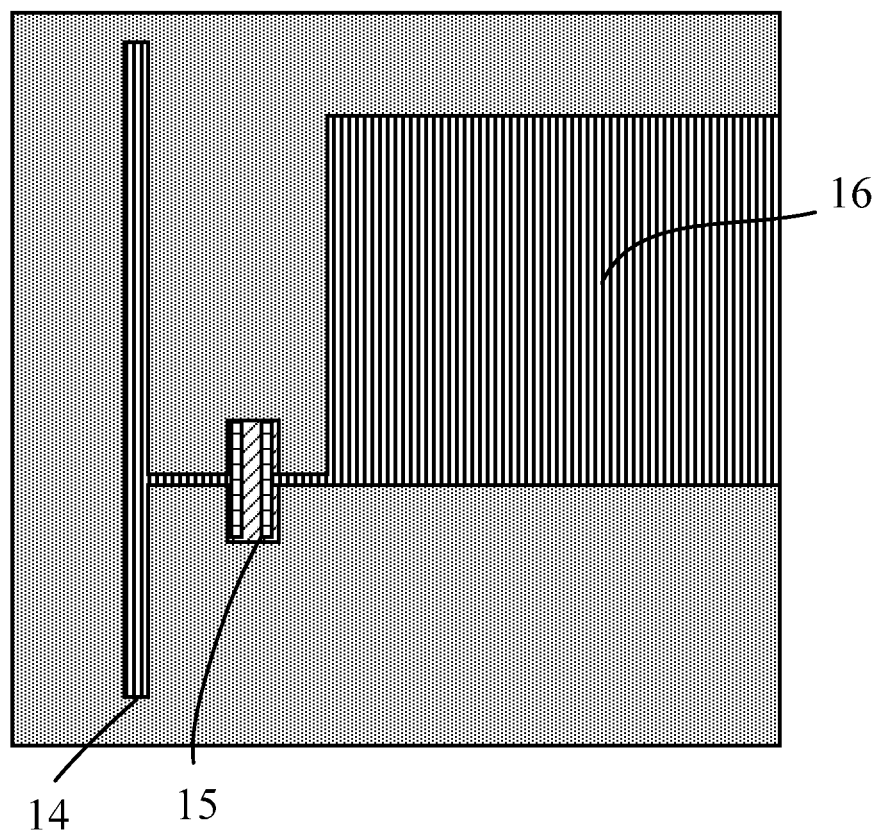
FIG. 2(b) is a schematic top view illustrating the OTFT array substrate after the steps 2 of the fabrication method of the OTFT array substrate have been completed according to an embodiment of the present invention.

As shown in FIG. 2(b), when looking down at the array substrate, apart from those regions which are above the region 14 corresponding to the data line, the region 15 corresponding to the source electrode and the drain electrode, as well as the region 16 corresponding to the pixel electrode covered with the organic semiconductor layer and the organic insulating layer, it can be seen that the entire surface of the array substrate at this point is covered with the organic insulating layer 28.

Steps 3: A metal layer is deposited on the organic insulating layer, and then a gate electrode and a scanning line are formed by a third mask process. Subsequently, an organic insulating layer is coated on the entire surface of the array substrate to form a passivation layer so that the passivation layer covers the entire surface of the array substrate.

Figure 3A:
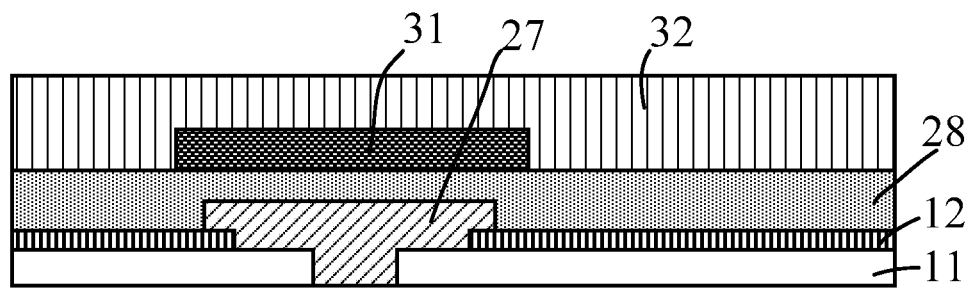
FIG. 3(a) is a schematic cross-sectional view illustrating the structure of the OTFT array substrate processed by the steps 3 of the fabrication method according to an embodiment of the present invention.
Figure 3B:
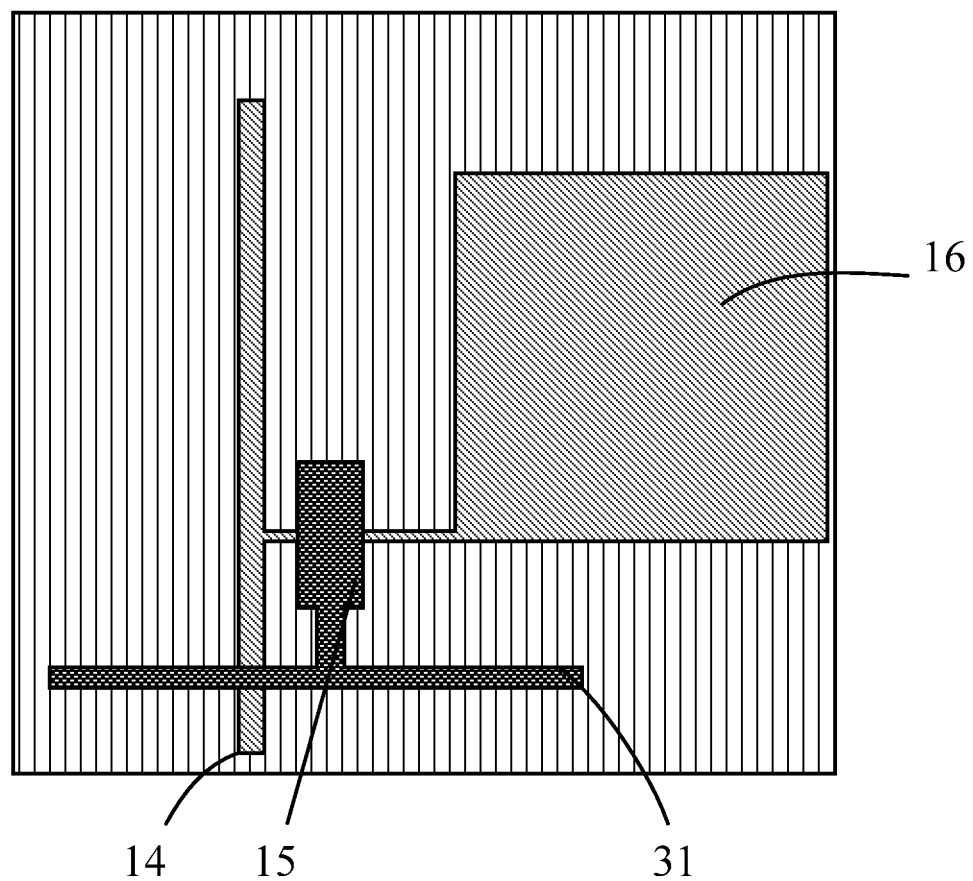
FIG. 3(b) is a schematic top view illustrating the OTFT array substrate after the steps 3 of the fabrication method of the OTFT array substrate have been completed according to an embodiment of the present invention.

Refer to FIG. 3 (a), which is a schematic, cross-sectional view illustrating the structure of the OTFT array substrate, which has been successively processed by the steps 3 of the fabrication method according to an embodiment of the present invention. On the surface of the organic insulating layer 28, a layer of a metal material such as aluminum (Al) based metal, molybdenum (Mo), chromium (Cr), tantalum (Ta) or copper (Cu) metal is deposited to form a metal thin film, and then followed by processes such as exposure, development, and patterning on the metal thin film by using a third mask to form the gate electrode and the scanning line 31 as shown in FIG. 3(a). Subsequently, a coating technique is used again to coat an organic insulating layer as the passivation layer 32. At this point, the third mask process is over, and a schematic top view of the array substrate can be seen as shown in FIG. 3(b).

As shown in FIG. 3(b), when looking down at the array substrate, in comparison with the FIG. 2(b), those regions which are above the region 14 corresponding to the data line, the region 15 corresponding to the source electrode and the drain electrode, as well as the region 16 corresponding to the pixel electrode are covered with the organic semiconductor layer, the organic insulating layer and the passivation layer. Furthermore, it can be seen that the entire surface of the array substrate at this point is covered with the passivation layer 32, and a region corresponding to the gate electrode and the scanning line 31 can be seen additionally.

Steps 4: A patterning process is performed on the passivation layer by using a fourth mask, and then a dry etching method is used to remove the organic insulating layer and the passivation layer situated on the surface of the pixel electrode on the array substrate and thereby the ITO pixel electrode is exposed to the outside.

Figure 4A:
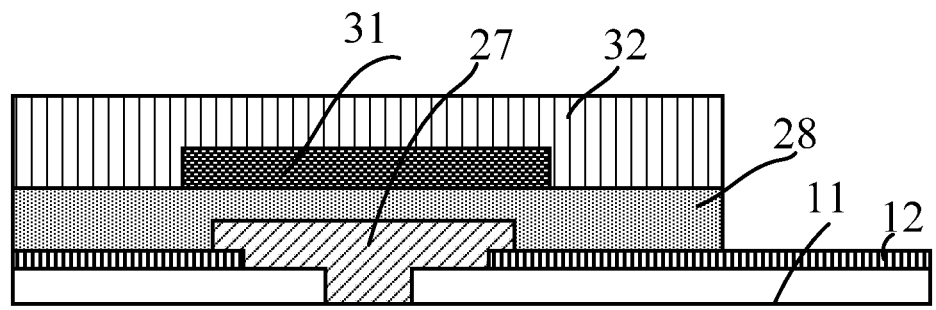
FIG. 4(a) is a schematic cross-sectional view illustrating the structure of the OTFT array substrate processed by the steps 4 of the fabrication method according to an embodiment of the present invention.
Figure 4B:
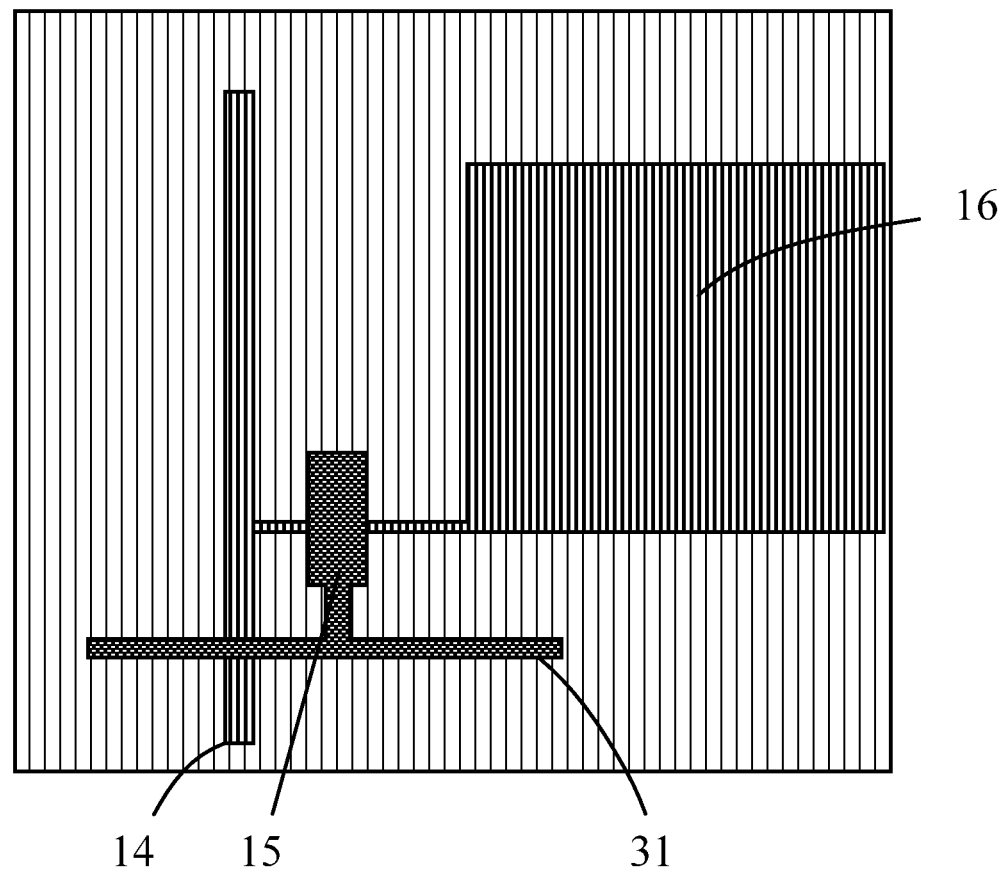
FIG. 4(b) is a schematic top view illustrating the OTFT array substrate after the steps 4 of the fabrication method of the OTFT array substrate have been completed according to an embodiment of the present invention.

Refer to FIG. 4(*a*), which is a schematic, cross-sectional view illustrating the structure of the OTFT array substrate, which has been successively processed by the steps 4 of the fabrication method according to an embodiment of the present invention. The passivation layer is performed with processes such as exposure, development, and patterning by using a fourth mask, as shown in FIG. 4(*a*), and then a dry etching method is used to remove the organic insulating layer 28 and the passivation layer 32 above the surface of the pixel electrode and thereby the ITO pixel electrode is exposed to the outside, preparing for fabrication of an OLED device at the next step. At this point, the fourth mask process is over, and a schematic top view of the array substrate can be seen as shown in FIG. 4(*b*).

As shown in FIG. 4(*b*), when looking down at the array substrate, in comparison with the FIG. 3(*b*), it can be seen that the ITO pixel electrode situated on the region 16 corresponding to the pixel electrode is allowed to be exposed to the outside.

Step 5: A layer of OLED material is deposited on the exposed ITO pixel electrode to form an OLED device.

Figure 5A:
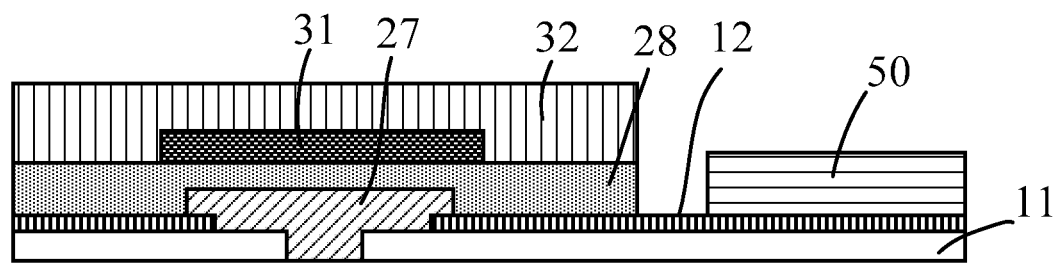
FIG. 5(a) is a schematic cross-sectional view illustrating the structure of the OTFT array substrate processed by the step 5 of the fabrication method according to an embodiment of the present invention.
Figure 5B:
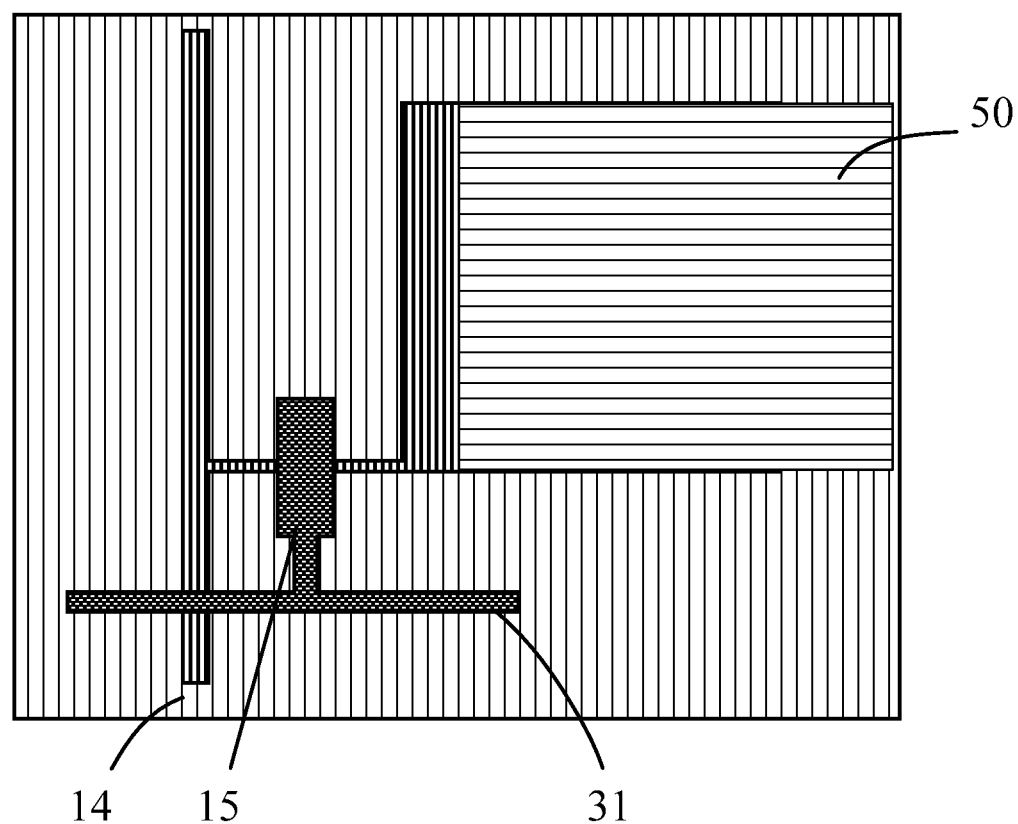
FIG. 5(b) is a schematic top view illustrating the OTFT array substrate after the step 5 of the fabrication method of the OTFT array substrate has been completed according to an embodiment of the present invention.

Finally, refer to FIG. 5(*a*), which is a schematic, cross-sectional view illustrating the structure of the OTFT array substrate, which has been successively processed by the step 5 of the fabrication method according to an embodiment of the present invention. On the exposed ITO pixel electrode, a layer of OLED material such as fluorescent material, phosphorescent material or the like is deposited to form an OLED device 50 as shown in FIG. 5(*a*). A process of depositing a layer of OLED material on the exposed ITO pixel electrode, includes, but is not limited to, for example, vapor depositions, sputtering depositions, or the like. At this point, the fabrication method of the OTFT array substrate is complete, and a schematic top view of the array substrate can be seen as shown in FIG. 5(*b*).

As shown in FIG. 5(*b*), the OLED material has vapor deposited on the exposed ITO pixel electrode, in comparison with the FIG. 4(*b*), thus it can be seen that the region 16 corresponding to the pixel electrode has been mostly covered by the OLED device 50.

The OLED display devices can be divided into a bottom-emission type, a top-emission type and an inverted top-emission type in accordance with its light emitting direction and structure configuration. Because the electrode of the underlying metal layer of the present invention does not transmit light, the structure configuration of the OTFT array substrate of the present invention is applicable only to the top-emission type OLED devices.

According to another embodiment of the present invention, an OTFT array substrate is further provided, the OTFT array substrate is fabricated by using the fabrication method of an OTFT array substrate of the present invention.

Referring to FIG. 5(*a*) and FIG. 5(*b*) together, in the embodiment of the present invention, a specific configuration of the OTFT array substrate comprises a substrate; a metal layer 11 formed on the substrate and an ITO layer 12 formed on the metal layer, allowing a partial metal layer to be exposed to the outside of the ITO layer after being patterned so that a source electrode and a drain electrode 15 are formed by using the partially exposed metal layer as well as a data line 14 and a pixel electrode 16 are formed by using the metal layer and the ITO layer; an organic semiconductor layer 27 covering the source electrode and the drain electrode to form an active layer; an organic insulating layer 28 disposed on the organic semiconductor layer and allowing the pixel electrode exposed to the outside; a gate electrode and a scanning line 31 disposed on the organic insulating layer; and a passivation layer 32 disposed on the gate electrode and covering the organic insulating layer.

After the passivation layer 32 has been performed with processes such as exposure, development, and patterning, a dry etching is used to remove the organic insulating layer and the passivation layer situated on the surface of the region of the pixel electrode on the array substrate so that the ITO pixel electrode is exposed to the outside.

The exposed pixel electrode is an anode of an OLED device, and the exposed pixel electrode has been deposited a layer of OLED material to form an OLED device 50. A process of depositing the layer of OLED material on the exposed ITO pixel electrode, includes, but is not limited to, for example, vapor depositions, sputtering depositions, or the like.

The fabrication method of an OTFT array substrate provided in the present invention simultaneously form a data line, a source electrode, a drain electrode and a pixel electrode by means of one mask process, and a surface of an underlying metal layer is entirely covered by an ITO layer except where the source electrode and the drain electrode are located. Therefore, the present invention can decrease not only the number of mask processes and improve the fabrication efficiency, but also can protect electrodes in the underlying metal layer of the OTFT array substrate and prevent them from oxidation in the subsequent processes of the fabrication method. As a result, the quality of a device made of the OTFT array substrate of the present invention can be ensured.

Despite one or more preferred embodiments of the present invention having been illustrated and described, those having ordinary skills in the art may easily contemplate equivalent changes and modifications according to the disclosure and drawings of the present invention. All such modifications and variations are considered to be encompassed in the scope defined by the claims of the present invention. Particularly with regard to the various functions performed by the above-described components, the terms used to describe such components are intended to perform the specified function corresponding to the component, which may be performed by any other components (functionally equivalent unless otherwise indicated), even though other components are not the same in the structure as shown in the exemplary implementations of this specification. Furthermore, although a particular feature relating to a number of embodiments has been disclosed in this specification, this feature may be combined with one or more other features to have other embodiments which are desirable and advantageous to a given or particular application. Moreover, the terms "including", "having", "containing", or variations thereof are used in the detailed description or the claims with a meaning similar to the term "comprising".

In summary, while the present invention has been described with the aforementioned preferred embodiments, it is preferable that the descriptions relating to the above embodiments should be construed as exemplary rather than as limiting of the present invention. One of ordinary skill in the art can make a variety of modifications and variations without departing from the spirit and scope of the present invention as defined by the following claims.

What is claimed is:

1. A method of fabricating an OTFT array substrate comprising the steps of:
   providing a base substrate;
   depositing a metal layer and an ITO layer on the base substrate, subsequently covering a photoresist layer thereon and then forming a data line, a source electrode, a drain electrode and a pixel electrode by a first mask process, wherein the first mask process comprises patterning the photoresist layer by using a first mask,
   wherein the first mask process further comprises wet etching the ITO layer and the underlying metal layer with an etching solution after the photoresist layer has been patterned, and subsequently ashing the photoresist layer by using plasma and removing a photoresist residue,
   wherein the surface of the metal layer is covered by the ITO layer except where the source electrode and the drain electrode are located after the first mask process has been completed;
   coating an organic semiconductor layer on the array substrate having the data line, the source electrode, the drain electrode, and the pixel electrode formed thereon and then forming an active layer by a second mask process, subsequently coating an organic insulating layer on the organic semiconductor layer to cover the organic semiconductor layer on an entire surface of the work-in-progress array substrate, wherein the second mask process comprises patterning the organic semiconductor layer by using a second mask;
   depositing a metal layer on the organic insulating layer and then forming a gate electrode and a scanning line by a third mask process, subsequently coating an organic insulating layer on the entire surface of the work-in-progress array substrate to form a passivation layer so that the passivation layer covers on the entire surface of the work-in-progress array substrate, wherein the third mask process comprises patterning the metal layer by using a third mask;
   exposing the pixel electrode by performing a fourth mask process to the passivation layer, wherein the fourth mask process comprises patterning the passivation layer by using a fourth mask; and
   depositing a layer of OLED material on the exposed pixel electrode to form an OLED device.

2. The method of fabricating an OTFT array substrate according to claim 1, wherein the fourth mask process further comprises removing the organic insulating layer and the passivation layer situated on the surface of the pixel electrode by dry etching.

3. The method of fabricating an OTFT array substrate according to claim 1, wherein the metallic material is silver (Ag) in the step of depositing the metal layer and the ITO layer on the substrate.

4. The method of fabricating an OTFT array substrate according to claim 1, wherein the material of the gate electrode and the scanning line is aluminum (Al) based metal, molybdenum (Mo), chromium (Cr), tantalum (Ta) or copper (Cu) metal.

5. The method of fabricating an OTFT array substrate according to claim 1, wherein the coating is performed by a dip coating, a spin coating, a blade coating or a contact coating.

6. The method of fabricating an OTFT array substrate according to claim 1, wherein the process of depositing the layer of OLED material on the exposed ITO pixel electrode comprises a vapor deposition or a sputtering deposition.

7. An OTFT array substrate which is fabricated by using the method of fabricating an OTFT array substrate according to claim 1.

8. An OTFT array substrate comprising:
   a base substrate;
   a metal layer formed on the substrate and an ITO layer formed on the metal layer to expose a portion of the metal layer to the outside of the ITO layer after being patterned so that a source electrode and a drain electrode are formed by using the partially exposed metal layer, as well as a data line and a pixel electrode are formed by using the metal layer and the ITO layer, wherein a surface of the metal layer is covered by the ITO layer except where the source electrode and the drain electrode are located after a first mask process has been completed;
   an organic semiconductor layer covering the source electrode and the drain electrode to form an active layer;
   an organic insulating layer disposed on the organic semiconductor layer and exposing the pixel electrode to the outside;
   a gate electrode and a scanning line disposed on the organic insulating layer; and
   a passivation layer disposed on the gate electrode and covering the organic insulating layer.

9. The OTFT array substrate according to claim 8, wherein the ITO pixel electrode is exposed after the passivation layer has been patterned and the organic insulating layer and the passivation layer situated on the surface of the region of the pixel electrode are removed by a dry etching process.

10. The OTFT array substrate according to claim 9, wherein the exposed pixel electrode is an anode of an OLED device.

11. The OTFT array substrate according to claim 9, wherein a layer of OLED material is deposited on the exposed ITO pixel electrode to form an OLED device.

12. The OTFT array substrate according to claim 11, wherein the OLED device is a top-emission type OLED device.

* * * * *